United States Patent
Ogle, Jr.

(10) Patent No.: US 6,278,166 B1
(45) Date of Patent: Aug. 21, 2001

(54) USE OF NITRIC OXIDE SURFACE ANNEAL TO PROVIDE REACTION BARRIER FOR DEPOSITION OF TANTALUM PENTOXIDE

(75) Inventor: Robert B. Ogle, Jr., San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/989,741

(22) Filed: Dec. 12, 1997

(51) Int. Cl.$^7$ ..................................................... H01L 29/76
(52) U.S. Cl. ........................ 257/411; 257/410; 257/412; 257/368; 257/635; 257/639; 257/649; 438/3; 438/287; 438/591; 438/592
(58) Field of Search ..................................... 257/411, 410, 257/412, 368, 649, 639, 635; 438/3, 287, 591, 592

(56) References Cited

U.S. PATENT DOCUMENTS

| 4,188,565 | * | 2/1980 | Mizukami et al. | 313/509 |
|---|---|---|---|---|
| 4,495,219 | * | 1/1985 | Kato et al. | 427/82 |
| 5,292,673 | * | 3/1994 | Shinriki et al. | 437/42 |
| 5,688,724 | * | 11/1997 | Yoon et al. | 437/235 |
| 5,763,300 | * | 6/1998 | Park et al. | 438/240 |
| 5,880,508 | * | 5/1999 | Wu | 257/411 |
| 6,040,230 | * | 3/2000 | Anthony et al. | 438/398 |

FOREIGN PATENT DOCUMENTS

| 2-265279 | * | 10/1990 | (JP) | 257/411 |
|---|---|---|---|---|
| 49010 | * | 10/1990 | (JP) | 257/411 |

* cited by examiner

Primary Examiner—Eddie Lee
Assistant Examiner—Matthew E Warren
(74) Attorney, Agent, or Firm—LaRiviere, Grubman & Payne, LLP

(57) ABSTRACT

The present invention provides a MOS structure and fabrication process for fabricating the substrate structure whereby a thin layer of silicon oxynitride, acting as a reaction barrier layer, and a tantalum pentoxide layer are formed in the gate region for controlling induction of electric charge in the gate region and thereby control the flow of current through the device. The high dielectric characteristic of the tantalum pentoxide facilitates blocking the flow of current in accordance with the applied voltage, and which in an off-state of the device, minimizes the gate leakage current. The silicon oxynitride barrier is formed by using a pre-deposition process of annealing the silicon substrate surface in a nitric oxide (NO) environment. The anneal may be a rapid thermal anneal (RTA) process for 10 seconds to 5 minutes at 400° C. to 1000° C. in the nitric oxide NO ambient. The annealing process produces the thin silicon oxynitride layer needed for depositing the tantalum pentoxide layer. After formation of the silicon oxynitride layer, the MOS structure undergoes a CVD deposition process for formation of a tantalum pentoxide layer on the silicon nitride surface. The silicon oxynitride layer formed using the pre-deposition anneal in nitric oxide (NO) (1) provides a hydrogen-free reaction barrier for depositing the tantalum pentoxide dielectric layer, (2) is formed at a lower temperature than a silicon nitride reaction barrier formed using ammonia, and (3) can function, when used alone, as a dielectric layer in applications that do not require the stringent off-state leakage current requirements. Other insulating material having a dielectric constant in the range of 25 to 80, such as titanium dioxide, may be formed over said silicon oxynitride layer for functioning as a reaction barrier layer.

6 Claims, 2 Drawing Sheets

USE OF NITRIC OXIDE SURFACE ANNEAL TO PROVIDE REACTION BARRIER FOR DEPOSITION OF TANTALUM PENTOXIDE

TECHNICAL FIELD

The present invention relates to integrated circuits and fabrication techniques for forming reaction barriers on the integrated circuit's substrate. More particularly, the present invention relates to integrated circuits and fabrication techniques for forming reaction barriers on the integrated circuit's silicon substrate that facilitate use of material having a higher dielectric constant than that provided by silicon dioxide, or silicon oxynitride. Even more particularly, the present invention relates to integrated circuits and fabrication techniques for forming reaction barriers on the integrated circuit's silicon substrate that facilitate use of high dielectric constant material, such as tantalum pentoxide $Ta_2O_5$.

BACKGROUND OF THE INVENTION

MOS technology requires a thin layer of dielectric material grown in the gate region to control induction of electric charge in the gate region to cause the flow of current through the device. Typically, the thin layer is a silicon dioxide ($SiO_2$) layer, or silicon nitride ($Si_3N_4$), or silicon oxynitride ($SiO_xN_y$) layer which is formed on the silicon substrate to function as a dielectric layer. The thin layer of silicon dioxide, or silicon nitride, or silicon oxynitride may also function as the dielectric material in fabricating capacitors in integrated circuits. The gate region blocks the flow of current in accordance with the applied voltage. In a reversed bias state, i.e. at cutoff, there exists a small amount of drain leakage current. The leakage current, even in the range of 1 amp per $cm^2$ can be significant for CMOS devices in flash memory or logic applications. These CMOS devices will require the use of high dielectric constant material to prevent leakage currents, typically a dielectric constant in the 25 to 80 range. Material layers of silicon dioxide, or silicon oxynitride, will not provide the gate leakage current requirements for future products since their dielectric constant is in the 3 to 8 range. Known insulating material having a dielectric constant in the 25 to 80 range include tantalum pentoxide ($Ta_2O_5$) and titanium dioxide ($TiO_2$.). (Note: Of these two materials, tantalum pentoxide is the preferred insulating material, thus, the specification will specifically discuss the preferred use of tantalum pentoxide and will generally refer to the titanium dioxide or, other high dielectric constant insulating material, where required.) Tantalum pentoxide cannot be deposited directly onto the silicon substrate because of undesirable chemical reaction with the silicon substrate. A solution to the reaction problem is to fabricate a reaction barrier between the tantalum pentoxide and the underlying silicon substrate. The known reaction barriers include using silicon dioxide, or silicon nitride underlying the tantalum pentoxide or the other chemical reaction causing insulating material. The silicon dioxide ($SiO_2$) layer, while effective as a reaction barrier, adds to the thickness of the total dielectric eliminating the advantage of the $Ta_2O_5$. As taught in an article entitled: "Ammonia ($NH_3$) Anneal of Silicon Surface to Prevent Reaction During Deposition/Formation of Tantalum Pentoxide", by Takahashi, p. 839, IEDM 1994, ammonia is used to form a silicon nitride barrier layer. The ammonia, however adds hydrogen to the interface of the device which causes unfavorable and unstable device characteristics.

To applicant's knowledge, a silicon oxynitride layer has not been formed using a pre-deposition anneal in nitric oxide (NO). A silicon oxynitride layer formed using a pre-deposition anneal in nitric oxide (NO) would not only be a reaction barrier for depositing the tantalum pentoxide dielectric, but would be hydrogen free, would be formed at a lower temperature than the ammonia, and could be alone as a dielectric layer in applications that do not require the stringent off-state leakage current requirements.

Thus, a primary object of the present invention is to provide a microelectronic integrated circuit substrate having a low gate leakage current characteristics ($10^{-2}$ amps per $cm^2$) facilitated by an insulating material layer, having a dielectric constant in the range of 25 to 80, and a silicon oxynitride reaction barrier formed using a pre-deposition anneal in nitric oxide (NO) process.

A particular object of the present invention is to provide a microelectronic integrated circuit substrate having a low gate leakage current characteristics ($10^{-2}$ amps per $cm^2$) facilitated by a tantalum pentoxide layer and a silicon oxynitride reaction barrier formed using a pre-deposition anneal in nitric oxide (NO) process.

A related object is to provide a fabrication process for producing a microelectronic integrated circuit substrate having a tantalum pentoxide layer and a silicon oxynitride reaction barrier without hydrogen, in accordance with the foregoing primary object.

Another related object is to provide a fabrication process for producing a microelectronic integrated circuit substrate having a silicon oxynitride isolation layer formed in accordance with the foregoing primary object and useable for other than as a reaction barrier layer.

BRIEF SUMMARY OF THE INVENTION

Accordingly, the foregoing objects are accomplished by providing a fabrication process whereby a thin layer of silicon oxynitride, acting as a reaction barrier layer, and a tantalum pentoxide layer are formed in the gate region to control induction of electric charge in the gate region and thereby control the flow of current through the device by blocking the flow of current in accordance with the applied voltage, and which, in a reversed bias state, i.e. in an off-state, minimize the amount of drain leakage current. The silicon oxynitride barrier is formed by using a pre-deposition process of annealing the silicon substrate surface, or an epitaxial silicon layer surface in a nitric oxide (NO) environment. The anneal may be a rapid thermal anneal (RTA) process for 10 seconds to 5 minutes at 400° C. to 1000° C. in the nitric oxide NO ambient. The annealing process in the nitric oxide ambient produces the thin silicon oxynitride layer needed for depositing the tantalum pentoxide layer. After formation of the silicon oxynitride layer, the MOS structure undergoes deposition of tantalum pentoxide on the silicon oxynitride surface.

Other features of the present invention are disclosed or apparent in the section entitled: "DETAILED DESCRIPTION OF THE INVENTION".

BRIEF DESCRIPTION OF DRAWINGS

For fuller understanding of the present invention, reference is made to the accompanying drawing in the following Detailed Description of the Invention. In the drawings.

Figure 1:
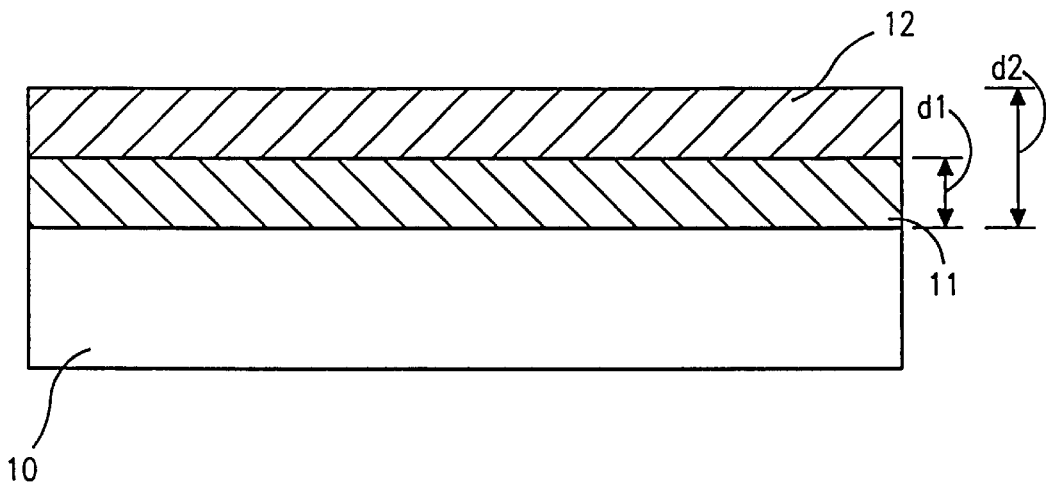
FIG. 1 is a cross-section of a prior art semiconductor substrate shown at a fabrication stage having a silicon dioxide layer functioning as a reaction barrier for a tantalum pentoxide layer formed over the silicon dioxide layer.

Reference numbers refer to the same or equivalent parts of the present invention throughout the several figures of the drawing.

DETAILED DESCRIPTION OF THE INVENTION

Figure 2:
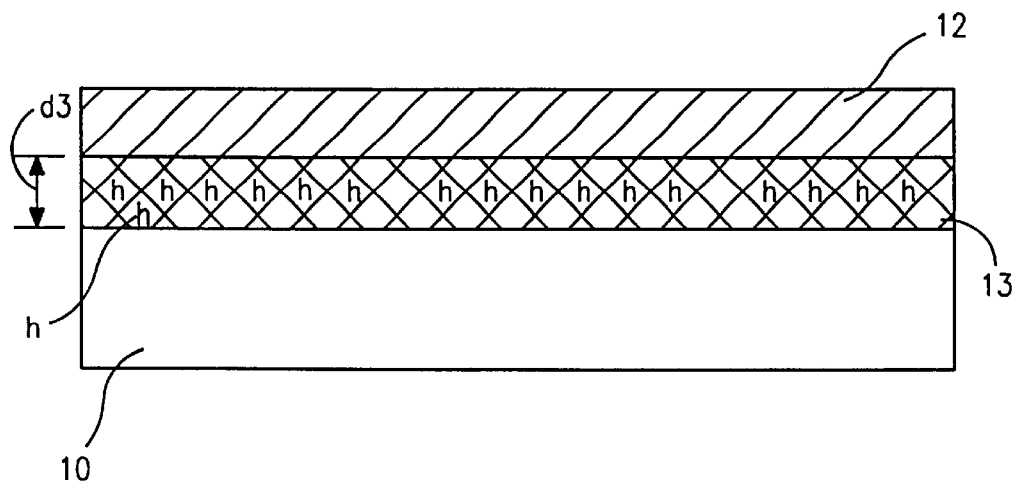
FIG. 2 is a cross-section of a semiconductor substrate shown at a fabrication stage having a silicon nitride passivation layer functioning as a reaction barrier for a tantalum pentoxide fabricated having hydrogen in accordance with the prior art.

FIG. 1 is a cross-section of a prior art semiconductor substrate 10 shown at a fabrication stage having a silicon dioxide layer 11 functioning as a reaction barrier for a tantalum pentoxide layer 12 formed over the silicon dioxide layer. Similarly, FIG. 2 shows a cross-section of a semiconductor substrate 10 at a fabrication stage having a silicon nitride reaction barrier layer 13, grown using ammonia, and functioning as a reaction barrier for a tantalum pentoxide layer 12. As discussed previously, and as depicted in FIG. 1, reaction barriers such as silicon dioxide ($SiO_2$) barrier layer 11 underlying tantalum pentoxide layer 12, while effective as a reaction barrier, has a thickness d1 which adds to the overall thickness d2 comprising the total dielectric material controlling energizing the MOS device. The added thickness d1 eliminates the advantage of the tantalum pentoxide $Ta_2O_5$. Silicon nitride is a better dielectric material than silicon dioxide and, accordingly, does not have to be deposited as a thick as silicon dioxide, i.e. d3 is substantially less than d1. One known process for growing silicon nitride is to use ammonia to form a silicon nitride barrier layer such as silicon nitride layer 13 depicted in FIG. 2. The ammonia, however adds hydrogen h to the silicon nitride layer 13, which causes unfavorable and unstable device characteristics in the MOS device.

Figure 3:
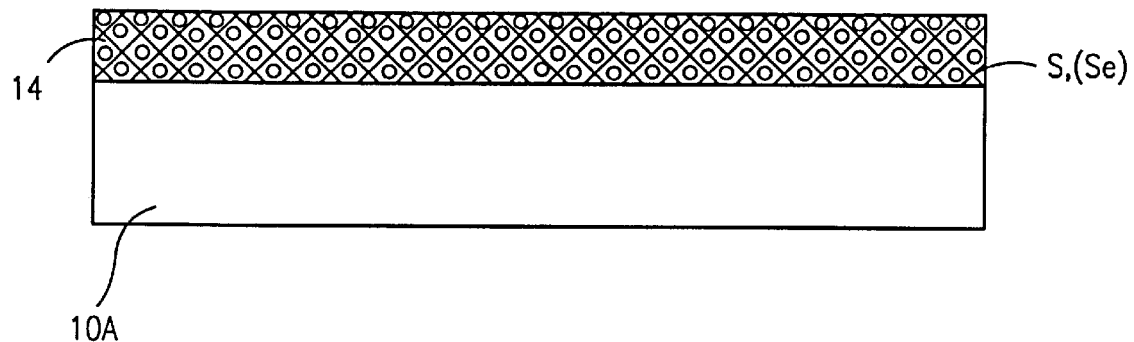
FIG. 3 is a cross-section of a semiconductor substrate shown at a pre-deposition of tantalum pentoxide fabrication stage having a silicon oxynitride passivation layer grown using a pre-deposition anneal in nitric oxide, in accordance with the present invention.
Figure 4:
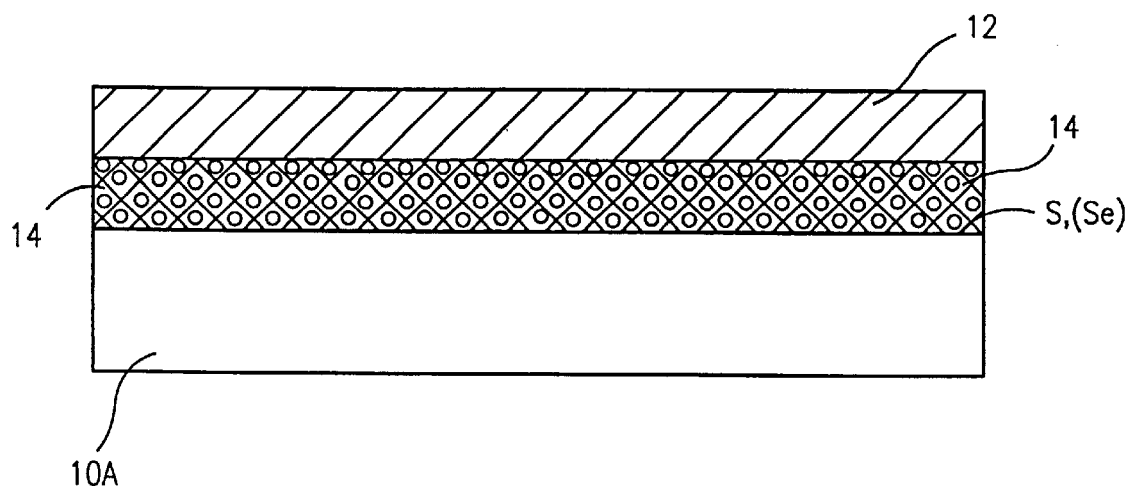
FIG. 4 is a cross-section of a semiconductor substrate shown at a fabrication stage having a silicon oxynitride reaction barrier grown using a pre-deposition anneal in nitric oxide process, as depicted in FIG. 3, and a tantalum pentoxide layer, in accordance with the present invention.

FIGS. 3 and 4 overcomes the prior art problems associated with silicon dioxide reaction barriers and silicon nitride reaction barriers containing hydrogen. As shown in FIG. 3, a silicon substrate 10A having a silicon surface S, or an epitaxial silicon surface Se, undergoes a nitric oxide annealing process. By example, the anneal process may comprise a rapid thermal anneal (RTA) process for 10 seconds to 5 minutes at 400° C. to 1000° C. in a nitric oxide NO ambient.

The formation of a silicon oxynitride layer 14 is conducted at the temperature range described above, which is substantially lower than a silicon nitride layer formed in accordance with the prior art using ammonia. The annealing process in the nitric oxide ambient produces the thin silicon oxynitride reaction barrier layer 14 needed for depositing the tantalum pentoxide layer. After formation of the silicon oxynitride layer 14, and as depicted in FIG. 4, the MOS structure shown in FIG. 3 undergoes a CVD deposition process, or other known deposition processes, for formation of tantalum pentoxide 12 on the silicon oxynitride layer 14. Alternatively, a layer of titanium dioxide may be formed in a similar manner if desired. As discussed previously, a silicon oxynitride layer 14 formed using a pre-deposition anneal in nitric oxide (NO) would not only be a reaction barrier for depositing the tantalum pentoxide dielectric layer 12, but would be hydrogen free, would be formed at a lower temperature than the ammonia, and could be used alone as a dielectric isolation layer, by example underlying a polysilicon layer, in applications that do not require the stringent gate leakage current requirements.

The present invention has been particularly shown and described with respect to a certain preferred embodiment and features thereof. However, it should be readily apparent to those of ordinary skill in the art that various changes and modifications in form, semiconductor material, material conductivity type, i.e. N-type, or P-type, and detail may be made without departing from the spirit and scope of the inventions as set forth in the appended claims. The inventions illustratively disclosed herein may be practiced without any element which is not specifically disclosed herein.

What is claimed is:

1. A gate structure apparatus for a MOS semiconductor device, said apparatus comprising:

a semiconductor substrate member,
said substrate member having a silicon surface;

a hydrogen-free silicon oxynitride layer formed on said silicon surface,
said hydrogen-free silicon oxynitride layer being formed by an anneal process comprising the steps of:
exposing said silicon surface to a hydrogen-free atmosphere of a pure nitric oxide, and
heating said silicon surface in said hydrogen-free atmosphere of said pure nitric oxide in a temperature range of 400° C. to 1000° C. for a time period of 10 seconds to 5 minutes; and an insulating material layer,
said insulating material layer having a dielectric constant in a range of 25 to 80, formed over said hydrogen-free silicon oxynitride layer, and
said hydrogen-free silicon oxynitride layer functioning as a reaction barrier layer for facilitating deposition of said insulating material layer.

2. A gate structure apparatus as described in claim 1, said apparatus further comprising:

a polysilicon layer formed over said silicon oxynitride layer.

3. A gate structure apparatus as described in claim 1, wherein:

said insulating material layer comprises a tantalum pentoxide layer formed over said silicon oxynitride layer.

4. A gate structure apparatus as described in claim 1, wherein:

said insulating material layer comprises a titanium dioxide layer formed over said silicon oxynitride layer.

5. A gate structure apparatus for a MOS semiconductor device, said apparatus comprising:

a semiconductor substrate member, said substrate member having a silicon surface;

a hydrogen-free silicon oxynitride layer formed on said silicon surface, said hydrogen-free silicon oxynitride layer being formed by an anneal process comprising the steps of:

exposing said silicon surface to hydrogen-free atmosphere of a pure nitric oxide, and heating said silicon surface in said hydrogen-free atmosphere of said pure nitric oxide in a temperature range of 400° C. to 1000° C. for a time period of 10 seconds to 5 minutes; and a tantalum pentoxide layer, said tantalum pentoxide layer being formed over said hydrogen-free silicon oxynitride layer, and said hydrogen-free silicon oxynitride layer functioning as a reaction barrier layer for facilitating deposition of said tantalum pentoxide layer.

6. A gate structure apparatus for a MOS semiconductor device as described in claim 5, wherein:

said silicon surface comprises an epitaxial silicon surface layer.

* * * * *